US008680897B2

(12) United States Patent
Itou et al.

(10) Patent No.: US 8,680,897 B2
(45) Date of Patent: Mar. 25, 2014

(54) SWITCHING ELEMENT CONTROL APPARATUS

(75) Inventors: Akito Itou, Kariya (JP); Tsuneo Maebara, Nagoya (JP); Takeyasu Komatsu, Chiryu (JP)

(73) Assignee: DENSO Corporation, Kariya (JP)

( * ) Notice: Subject to any disclaimer, the term of this patent is extended or adjusted under 35 U.S.C. 154(b) by 0 days.

(21) Appl. No.: 13/359,781

(22) Filed: Jan. 27, 2012

(65) Prior Publication Data

US 2012/0194226 A1   Aug. 2, 2012

(30) Foreign Application Priority Data

Jan. 28, 2011   (JP) .................................. 2011-016732

(51) Int. Cl.
H03B 1/00          (2006.01)
H03K 17/0412       (2006.01)
(52) U.S. Cl.
CPC .............................. H03K 17/04126 (2013.01)
USPC ........................................................ 327/109
(58) Field of Classification Search
USPC .................... 327/108–112, 170, 389, 391;
326/22–27, 82, 83; 365/230.06
See application file for complete search history.

(56) References Cited

U.S. PATENT DOCUMENTS

2003/0001630 A1   1/2003  Sakata et al.
2008/0290853 A1*  11/2008 Ito ................................. 323/283
2009/0002054 A1   1/2009  Tsunoda et al.
2009/0066402 A1   3/2009  Hiyama
2010/0213989 A1   8/2010  Nakatake et al.

FOREIGN PATENT DOCUMENTS

| JP | 2003-087104 | 3/2003 |
| JP | 2007-116760 | 5/2007 |
| JP | 2009-011049 | 1/2009 |
| JP | 2009-071956 | 4/2009 |
| JP | 2009-225531 | 10/2009 |
| JP | 2010-34746  | 2/2012 |
| WO | 2009/044602 | 4/2009 |

OTHER PUBLICATIONS

Office Action (3 pgs.) dated Jan. 29, 2013 issued in corresponding Japanese Application No. 2011-016732 with an at least partial English-language translation thereof (2 pgs.).

* cited by examiner

*Primary Examiner* — Lincoln Donovan
*Assistant Examiner* — Sibin Chen
(74) *Attorney, Agent, or Firm* — Nixon & Vanderhye P.C.

(57) ABSTRACT

A switching element control apparatus capable of controlling a switching element that is driven by controlling a voltage on its control terminal properly in response to characteristic information of the switching element. The apparatus includes a constant current circuit that applies a constant current to the control terminal, a voltage-limiting circuit that limits the voltage on the control terminal so as not to exceed a limiting voltage, and a control circuit that controls the constant current circuit to apply the constant current to the control terminal when having received a drive signal for turning on the switching element, and controls the voltage-limiting circuit to limit the voltage on the control terminal for a voltage-limiting time period. The control circuit includes a memory storing the characteristic information and variably sets at least one of the limiting voltage, the voltage-limiting time period, and the constant current in response to the characteristic information.

19 Claims, 7 Drawing Sheets

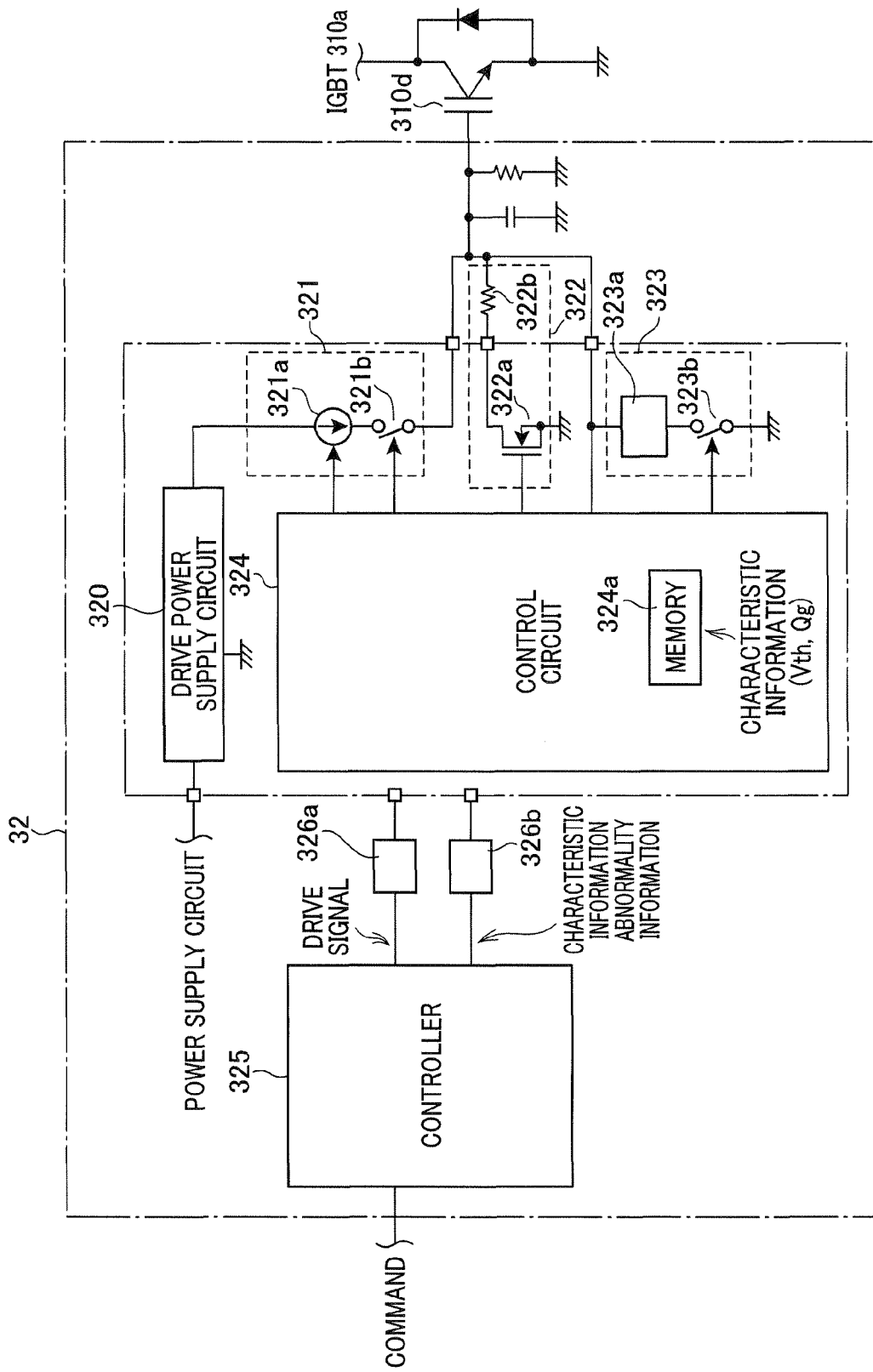

SWITCHING ELEMENT CONTROL APPARATUS

CROSS-REFERENCE TO RELATED APPLICATION

This application is based on and claims the benefit of priority from earlier Japanese Patent Application No. 2011-16732 filed Jan. 28, 2011, the description of which is incorporated herein by reference.

BACKGROUND

1. Technical Field

This invention relates to a switching element control apparatus for controlling a switching element that is driven by controlling a voltage on its control terminal.

2. Related Art

One of known switching element control apparatuses for controlling a switching element that is driven by controlling a voltage on its control terminal is a gate drive circuit disclosed in Japanese Patent Application Publication No. 2009-071956.

The gate drive circuit disclosed in Japanese Patent Application Publication No. 2009-071956 is adapted to drive a power switching element. The disclosed gate drive circuit includes a first turn-on side power supply circuit and a second turn-on side power supply circuit. The first turn-on side power supply circuit includes a first turn-on voltage source and a first switch. The second turn-on side power supply circuit includes a second turn-on voltage source, a second switch, and a turn-on side delay circuit. A first turn-on voltage of the first turn-on voltage source is set lower than a second turn-on voltage of the second turn-on voltage source.

When a command signal for turning on the power switching element is inputted to the gate drive circuit, the first switch is turned on and the first turn-on voltage of the first turn-on voltage source is applied to a gate of the power switching element. The command signal is delayed by the turn-on side delay circuit. When the command signal delayed by the turn-on side delay circuit is inputted to the second switch, the second switch is turned on and the second turn-on voltage of the second turn-on voltage source is applied to the gate of the power switching element. That is, the first turn-on voltage lower than the second turn-on voltage is applied to the gate of the power switching element during turn-on operation of the power switching element, and then when the power switching element transitions to a steady state, the second turn-on voltage is applied to the power switching element.

Keeping the gate voltage at a low level during turn-on operation of the power switching element can suppress a collector current following through the power switching element. This can prevent breakage due to a surge voltage and breakage due to heat generation even when the power switching element is turned off in the presence of an abnormality, which can increase a tolerance of the power switching element to breakage. Raising the gate voltage upon transition to the steady state can reduce steady state losses of the power switching element.

However, since the disclosed gate drive circuit includes two power supplies having mutually different voltages, the gate drive circuit has a more complicated circuit configuration.

In addition, since switching characteristics are varied with power switching elements, a delay time of the turn-on side delay circuit, the first turn-on voltage of the first turn-on voltage source, and the second turn-on voltage of the second turn-on voltage source have to be set in response to the characteristics so that the power switching element can be controlled properly. However, the delay time, the first turn-on voltage, and the second turn-on voltage are set by hardware, which makes their settings unable to be changed in response to the characteristics of the power switching element. This prevents the power switching element from being controlled properly in response to its characteristics.

In consideration of the foregoing, exemplary embodiments of the present invention are directed to providing a simply constructed switching element control apparatus capable of controlling a switching element properly in response to its characteristics.

SUMMARY

In accordance with an exemplary embodiment of the present invention, there is provided a switching element control apparatus including: a constant current circuit that applies a constant current to a control terminal of a switching element driven by controlling a voltage on the control terminal; a voltage-limiting circuit that limits the voltage on the control terminal of the switching element so as not to exceed a limiting voltage set in the voltage-limiting circuit; and a control circuit that controls the constant current circuit to apply the constant current to the control terminal of the switching element when the control circuit receives a drive signal for turning on the switching element, and controls the voltage-limiting circuit to limit the voltage on the control terminal of the switching element for a voltage-limiting time period. The control circuit includes a memory storing characteristic information of the switching element and variably sets at least one of the limiting voltage, the voltage-limiting time period, and the constant current in response to the characteristic information stored in the memory.

This allows the voltage on the control terminal of the switching element to be adjusted by the constant current circuit and the voltage-limiting circuit without using the two power supplies as in the conventional gate drive circuit, which can simplify the overall circuit configuration of the apparatus. In addition, the constant current circuit and/or the voltage-limiting circuit can be controlled properly in response to the characteristic information of the switching element previously stored in the memory, which allows the switching element to be controlled properly in response to its characteristic information.

BRIEF DESCRIPTION OF THE DRAWINGS

In the accompanying drawings:

FIG. 6 schematically shows a circuit diagram of a control unit in accordance with a third embodiment of the present invention;

DESCRIPTION OF SPECIFIC EMBODIMENTS

The present invention will be described more fully hereinafter with reference to the accompanying drawings. Like numbers refer to like elements throughout.

(First Embodiment)

Figure 1:
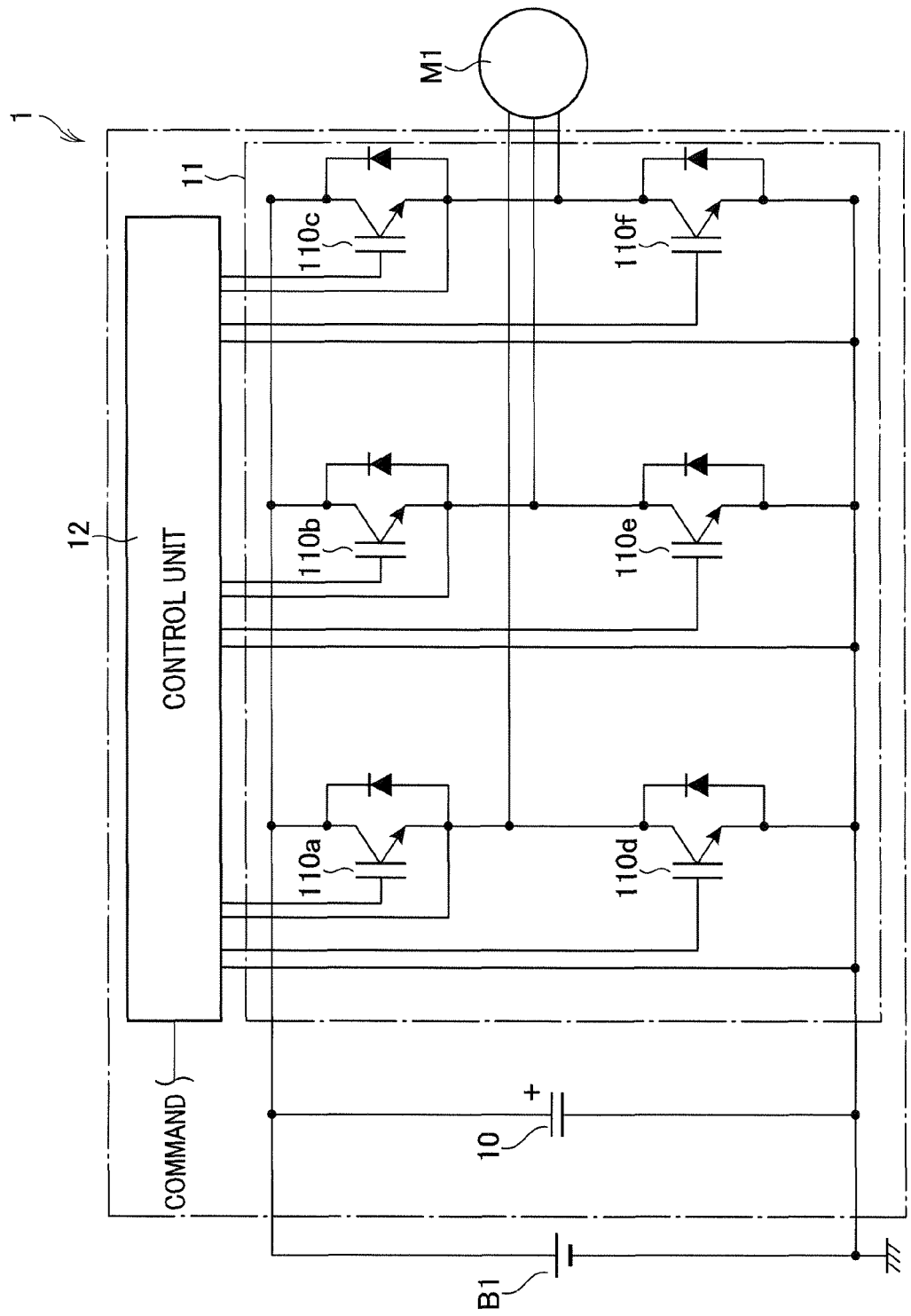
FIG. 1 schematically shows a circuit diagram of a motor control apparatus in accordance with a first embodiment of the present invention.

FIG. 1 schematically shows a circuit diagram of a motor control apparatus in accordance with a first embodiment of the present invention.

As shown in FIG. 1, the motor control apparatus 1 includes a smoothing capacitor 10, an inverter arrangement 11, and a control unit 12. The motor control apparatus 1 controls a vehicle drive motor M1 by converting a high direct-current (DC) voltage (e.g., 288V) of a high-voltage battery B1 electrically insulated from the vehicle body into three-phase alternating voltages and supplying the three-phase alternating voltages to the vehicle drive motor M1.

The smoothing capacitor 10 smoothes the high DC voltage of the high-voltage battery B1. One end of the smoothing capacitor 10 is electrically connected to a positive terminal of the high-voltage battery B1. The other end of the smoothing capacitor 10 is electrically connected to a negative terminal of the high-voltage battery B1. The negative terminal of the high-voltage battery B1 is further electrically connected to ground for the high-voltage battery electrically insulated from the vehicle body.

The inverter arrangement 11 includes six insulated gate bipolar transistors (IGBTs) 110a-110f to convert the DC voltage smoothed by the smoothing capacitor 10 into the three-phase alternating voltages and supply the three-phase alternating voltages to the vehicle drive motor M1.

Each of the IGBTs 110a-110f is turned on and off by controlling a voltage on its gate (control terminal), thereby converting the DC voltage smoothed by the smoothing capacitor 10 into the three-phase alternating voltages. A pair of IGBTs 110a, 110d are electrically connected in series, a pair of IGBTs 110b, 110e are electrically connected in series, and a pair of IGBTs 110c, 110f are electrically connected in series. More specifically, an emitter of the IGBT 110a is electrically connected to a collector of the IGBT 110d, an emitter of the IGBT 110b is electrically connected to a collector of the IGBT 110e, and an emitter of the IGBT 110c is electrically connected to a collector of the IGBT 110f. The pair of IGBTs 110a, 110d, the pair of IGBTs 110b, 110e, and the pair of IGBT 110c, 110f are electrically connected in parallel with each other. More specifically, the collectors of the IGBT 110a-110c are electrically connected to one end of the smoothing capacitor 10, and the emitters of the IGBTs 110d-110f are electrically connected to the other end of the smoothing capacitor 10. In addition, the gate and emitter of each of the IGBTs 110a-110f are electrically connected to the control unit 12. Further, a serial connection point between the IGBTs 110a, 110d, a serial connection point between the IGBTs 110b, 110e, and a serial connection point between the IGBT 110c, 110f are electrically connected to the vehicle drive motor M1.

The control unit 12 is responsible for controlling the IGBTs 110a-110f. The gate and emitter of each of IGBTs 110a-110f are electrically connected to the control unit 12.

Figure 2:
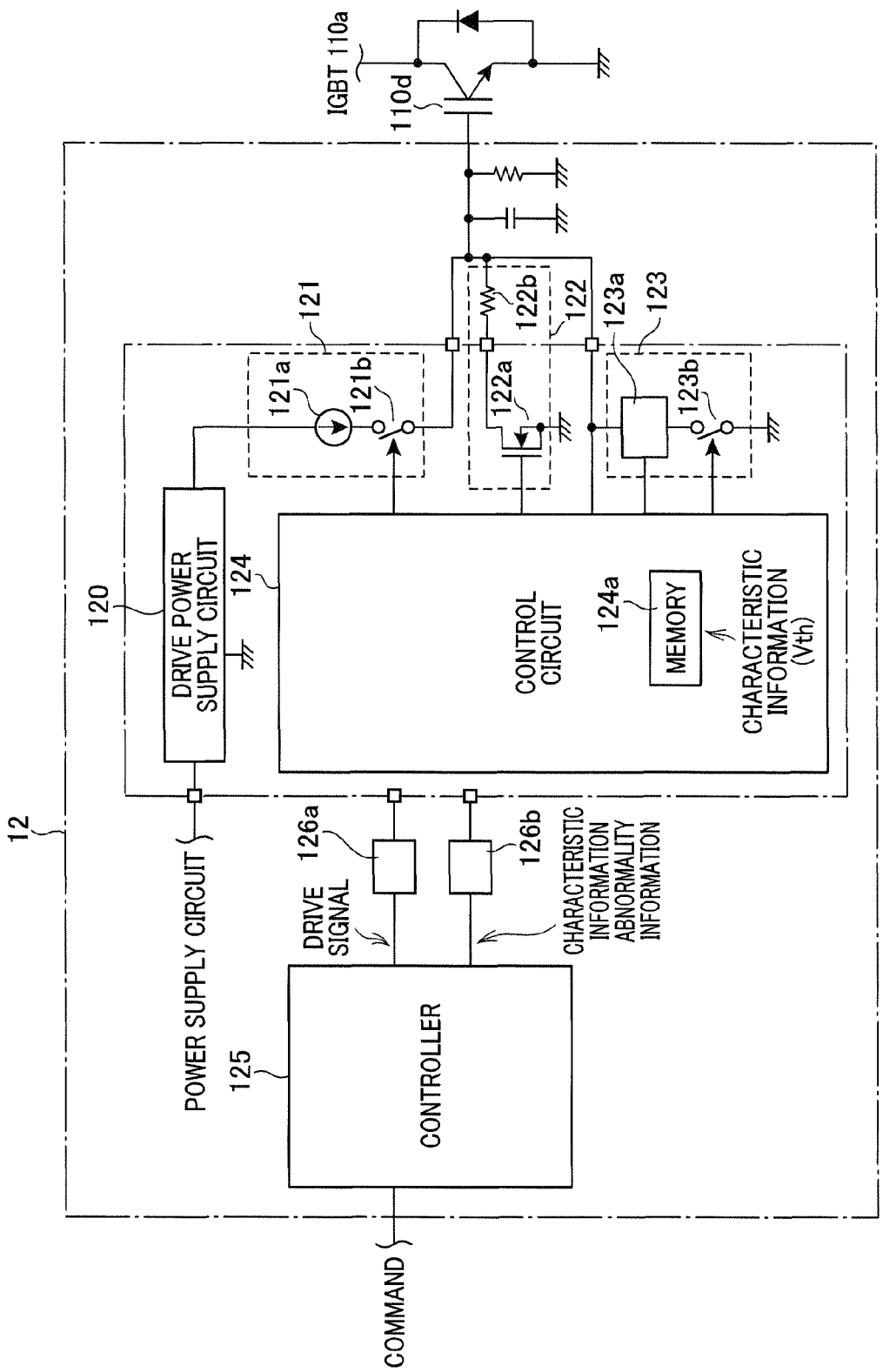
FIG. 2 schematically shows a circuit diagram of a control unit illustrated in FIG. 1.

There will now be explained the control unit 12 with reference to FIG. 2. FIG. 2 schematically shows a circuit diagram of the control unit 12 illustrated in FIG. 1, where only one IGBT 110d and its associated circuit portion of the control unit 12 is shown for simplicity.

As shown in FIG. 2, the control unit 12 includes a drive power supply circuit 120, a turn-on drive constant current circuit 121, a turn-off drive circuit 122, a voltage-limiting circuit 123, and a control circuit 124, for the IGBT 110d. The control unit 12 includes a controller 125 for the IGBTs 110a-110f. The control unit 12 further includes a similar drive power supply circuit, a similar turn-on drive constant current circuit, a similar turn-off drive circuit, a similar voltage-limiting circuit, and a similar control circuit, for each of the other IGBTs 110a-110c, 110e, 110f.

The drive power supply circuit 120 supplies a voltage for driving the IGBT 110d. The drive power supply circuit 120 stabilizes an output voltage of a power supply circuit (not shown) and outputs the stabilized voltage.

An input terminal of the drive power supply circuit 120 is electrically connected to the power supply circuit. A positive terminal of the drive power supply circuit 120 is electrically connected to the turn-on drive constant current circuit 121. A negative terminal of the drive power supply circuit 120 is electrically connected to ground for the high-voltage battery, through which the negative terminal is electrically connected to the emitter of the IGBT 110d.

The turn-on drive constant current circuit 121 is operative to turn on the IGBT 110d. More specifically, the turn-on drive constant current circuit 121 turns on the IGBT 110d in response to a command from the control circuit 124 by applying a constant current to the gate of the IGBT 110d to charge the gate of the IGBT 110d, thereby raising the gate voltage $(V_G)$ above the ON/OFF threshold voltage. The turn-on drive constant current circuit 121 includes a constant current source 121a and a switch 121b.

The constant current source 121a outputs the constant current. A power supply terminal of the constant current source 121a is electrically connected to a positive terminal of the drive power supply circuit 120. An output terminal of the constant current source 121a is electrically connected to the switch 121b.

The switch 121b is operative to connect the constant current source 121a to the gate of the IGBT 110d in response to the command from the control circuit 124. One end of the switch 121b is electrically connected to an output terminal of the constant current source 121a. The other end of the switch 121b is electrically connected to the gate of the IGBT 110d. A control terminal of the switch 121b is electrically connected to the control circuit 124.

The turn-off drive circuit 122 is operative to turn off the IGBT 110d. More specifically, the turn-off drive circuit 122 discharges the gate of the IGBT 110d to lower the gate voltage below the ON/OFF threshold voltage, thereby turning off the IGBT 110d. The turn-off drive circuit 122 includes a turn-off drive FET 122a and a turn-off drive resistor 122b.

The turn-off drive FET 122a, which is an N-channel MOSFET in the present embodiment, is turned on by controlling the voltage on its gate to discharge the gate of the IGBT 110d. A source of the turn-off drive FET 122a is electrically connected to ground for the high-voltage battery, through which the source of the turn-off drive FET 122*a* is electrically connected to the negative terminal of the drive power supply circuit 120 and the emitter of the IGBT 110*d*. The drain of the turn-off drive FET 122*a* is electrically connected to the gate of the IGBT 110*d* through a turn-off drive resistor 122*b*. The gate of the turn-off drive FET 122*a* is electrically connected to the control circuit 124.

The voltage-limiting circuit 123 is operative to limit the gate voltage of the IGBT 110*d* so as not to exceed a limiting voltage set by the control circuit 124 for a voltage-limiting time period. The voltage-limiting circuit 123 includes a clamp circuit 123*a* and a switch 123*b*.

The clamp circuit 123*a* limits the gate voltage of the IGBT 110*d* so as not to exceed the predefined limiting voltage set by the control circuit 124. One end of the clamp circuit 123*a* is electrically connected to the gate of the IGBT 110*d*. The other end of the clamp circuit 123*a* is electrically connected to the switch 123*b*. A control terminal of the clamp circuit 123*a* is electrically connected to the control circuit 124.

The switch 123*b* connects the clamp circuit 123*a* to the gate of the IGBT 110*d* in response to a command from the control circuit 124. One end of the switch 123*b* is electrically connected to the clamp circuit 123*a*. The other end of the switch 123*b* is electrically connected to ground for the high-voltage battery, through which the other end of the switch 123*b* is electrically connected to the negative terminal of the drive power supply circuit 120 and the emitter of the IGBT 110*d*. A control terminal of the switch 123*b* is electrically connected to the control circuit 124.

The control circuit 124, which includes a memory 124*a*, variably sets the limiting voltage of the clamp circuit 123*a* in response to characteristic information of the IGBT 110*d* stored in the memory 124*a*, and controls the clamp circuit 123*a* to limit the gate voltage of the IGBT 110*d* so as not to exceed the limiting voltage. More specifically, the characteristic information includes the ON/OFF threshold voltage of the IGBT 110*d*, and the limiting voltage is set higher than the ON/OFF threshold voltage.

The control circuit 124 further controls the switch 121*b* and the turn-off drive FET 122*a* in response to a drive signal received from the controller 125, and controls the switch 123*b* in response to the gate voltage of the IGBT 110*d*. In addition, the control circuit 124 outputs the characteristic information of the IGBT 110*d* stored in the memory 124*a* to the controller 125. When the control circuit 124 is unable to read the characteristic information of the IGBT 110*d* from the memory 124*a*, the control circuit 124 outputs abnormality information to the controller 125.

The memory 124*a*, which is a nonvolatile memory in the present embodiment, stores the characteristic information of the IGBT 110*d*. There is stored in the memory 124*a* the ON/OFF threshold voltage for the IGBT 110*d* previously measured in a ready-mounted state of the motor control apparatus 1.

The control circuit 124 is electrically connected to the controller 125, the control terminal of the switch 121*b*, and the gate of the turn-off drive FET 122*a*. The control circuit 124 is further electrically connected to the gate of the IGBT 110*d*, the control terminal of the clamp circuit 123*a*, and the control terminal of the switch 123*b*.

The drive power supply circuit 120, the turn-on drive constant current circuit 121, the turn-off drive FET 122*a*, the voltage-limiting circuit 123, and the control circuit 124 are integrated into an integrated circuit (IC) having a plurality of terminals. The memory 124*a* is electrically connected to some of the plurality of terminals of the control circuit 124, via which the other circuit sections, such as the drive power supply circuit 120, the turn-on drive constant current circuit 121, the turn-off drive FET 122*a*, and the voltage-limiting circuit 123, are electrically connected to the control circuit 124. The ON/OFF threshold voltage of the IGBT 110*d* can be stored in the memory 124*a* by means of such terminals via which the other circuit sections are electrically connected to the control circuit 124.

The controller 125 generates the drive signal for turning on/off the IGBT 110*d* in response to an external command, and outputs the drive signal. The controller 125 checks for an abnormality in the characteristic information of the IGBT 110*d* stored in the memory 124*a* received from the control circuit 124. When it is determined that there exists an abnormality in the characteristic information, the controller 125 stops outputting of the drive signal. In addition, when the controller 125 receives the abnormality information from the control circuit 124, the controller 125 stops outputting of the drive signal. A drive signal output terminal of the controller 125 is electrically connected to a drive signal input terminal of the control circuit 124 through a photo-coupler 126*a*. An information input terminal of the controller 125 is electrically connected to an information output terminal of the control circuit 124 through a photo-coupler 126*b*.

Operation of the motor control apparatus 1 will now be explained with reference to FIG. 1. Turn-on of an ignition switch (not shown) of the vehicle triggers the motor control apparatus 1 to operate. The high DC voltage of the high-voltage battery B1 is smoothed by the smoothing capacitor 10. The control unit 12 controls the IGBTs 110*a*-110*f* included in the inverter arrangement 11 in response to the external command. More specifically, each of the IGBTs 110*a*-110*f* is turned on and off alternately at a predetermined frequency. The inverter arrangement 11 converts the high DC voltage smoothed by the smoothing capacitor 10 into the three-phase alternating voltages and supplies the three-phase alternating voltages to the vehicle drive motor M1, thereby controlling the motor control apparatus 1.

Figure 7A:
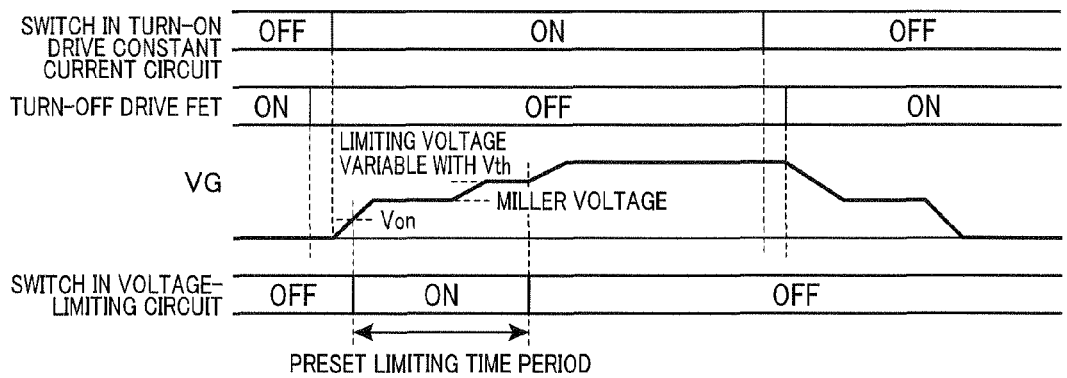
FIG. 7A schematically shows a timing diagram for the control unit in accordance with the first embodiment of the present invention.

There will now be explained a driving action of the IGBT 110*d* with reference to FIG. 2 and FIG. 7A. FIG. 7A shows a timing diagram for the control unit 12 in accordance with the first embodiment of the present invention.

The controller 125 generates a drive signal in response to the external command, and outputs the drive signal to the control circuit 124. Upon reception of the drive signal, the control circuit 124 sets the limiting voltage of the voltage-limiting circuit 123 to be higher than the ON/OFF threshold voltage Vth of the IGBT 110*d* stored in the memory 124*a*, and controls the clamp circuit 123*a* so that the gate voltage of the IGBT 110*d* is limited so as not to exceed the limiting voltage. When the drive signal received from the controller 125 through the photo-coupler 126*a* indicates turn-on of the IGBT 110*d*, the control circuit 124 turns off the turn-off drive FET 122*a* and turns on the switch 121*b* to apply the constant current from the constant current source 121*a* to the gate of the IGBT 110*d*. This allows the gate of the IGBT 110*d* to be charged, which leads to rise of the gate voltage.

When the gate voltage is raised to exceed the ON/OFF threshold voltage Vth, the IGBT 110*d* is turned on and a collector current starts to flow through the IGBT 110*d*. As shown in FIG. 7A, when the gate voltage reaches a predetermined voltage $V_{ON}$ (preferably, equal to or higher than Vth), the control circuit 124 turns on the switch 123*b* to start the gate voltage limitation. The rise of the gate voltage is then halted at a Miller voltage for some time. The gate voltage is further raised after the halt, but the gate voltage of the IGBT 110*d* is limited by the voltage-limiting circuit 123 so as not to exceed the limiting voltage. The control circuit 124 turns off the switch 123b the voltage-limiting time period after the start of the gate voltage limitation to remove the limiting voltage. After the gate voltage limitation is ended, the gate voltage is raised to the output voltage of the drive power supply circuit 120.

In other words, when the gate voltage exceeds the ON/OFF threshold voltage where the IGBT 110d is turned on, the gate voltage is limited by the voltage-limiting circuit 123 so as not to exceed the limiting voltage. When the gate voltage limitation is ended, the gate voltage is raised to the output voltage of the drive power supply circuit 120. Accordingly, even when the IGBT 110d is turned off in the presence of an abnormality as in the prior art, breakage due to a surge voltage (which depends on the gate voltage up to the Miller voltage) and breakage due to heat generation can be suppressed. This increases a tolerance of the IGBT 110d to breakage. In addition, the gate voltage is raised after transition to a steady state of the IGBT 110d, which can reduce steady state loses of the IGBT 110d.

On the other hand, when the control circuit 124 receives the drive signal for turning off the IGBT 110d through the photocoupler 126a, the control circuit 124 turns off the switch 121b and turns on the turn-off drive FET 122a, thereby discharging the gate of the IGBT 110d through the resistor 122b. Accordingly, the gate voltage is lowered below the ON/OFF threshold voltage, and the IGBT 110d is turned off.

The control circuit 124 outputs the characteristic information of the IGBT 110d stored in the memory 124a to the controller 125. When the control circuit 124 is unable to read the characteristic information of the IGBT 110d from the memory 124a, the control circuit 124 outputs the abnormality information to the controller 125.

The controller 125 checks for an abnormality in the characteristic information of the IGBT 110d received from the control circuit 124. When there exists an abnormality in the characteristic information, the controller 125 stops outputting of the drive signal. Also, when the controller 125 receives the abnormality information from the control circuit 124, the controller 125 stops outputting of the drive signal.

Some advantages of the present embodiment will now be explained in the following. According to the first embodiment, the gate voltage of the IGBT 110d can be adjusted by the turn-on drive constant current circuit 121 and the voltage-limiting circuit 123 without using the two power supplies as in the disclosed gate drive circuit. This can simplify the overall circuit configuration of the motor control apparatus 1. In addition, controlling the voltage-limiting circuit 123 in response to the previously-stored characteristic information of the IGBT 110d in the memory 124a allows the IGBT 110d to be controlled properly in response to the characteristic information of the IGBT 110d.

In the first embodiment described above, the ON/OFF threshold voltage is varied with IGBTs, which causes a difference in turn-on timing of IGBT and thus to a difference in heat generation amount. However, variably setting the limiting voltage in response to the ON/OFF threshold voltage can suppress the collector current flowing through the IGBT 110d during turn-on operation in response to its characteristics, thereby suppressing the heat generation amount of the IGBT 110d. This can ensure the tolerance of the IGBT 110d to breakage properly in response to its characteristics. In addition, variably setting the limiting voltage in response to the ON/OFF threshold voltage can suppress the steady state losses of the IGBT 110d in response to its characteristics.

In the first embodiment, the control circuit 124 outputs the characteristic information of the IGBT 110d stored in the memory 124a to the controller 125, which allows the controller 125 to check for an abnormality in the characteristic information of the IGBT 110d received from the control circuit 124.

In first embodiment, when the control circuit 124 is unable to read the characteristic information of the IGBT 110d from the memory 124a, the control circuit 124 outputs the abnormality information to the controller 125, which allows the controller 125 to be notified of an abnormal state such that the control circuit 124 is unable to read the characteristic information of the IGBT 110d from the memory 124a.

In the first embodiment, since the characteristic information of the IGBT 110d is measured previously and then stored in the memory 124a, the characteristic information of the IGBT 110d can be stored reliably in the memory 124a, which allows the IGBT 110d to be controlled properly in response to its characteristics.

In the first embodiment, the memory 124a is electrically connected to some terminals, among the plurality of terminals of the control circuit 124, which are electrically connected to the other circuit sections. The characteristic information of the IGBT 110d is stored in the memory 124a via such terminals as connected to the other circuit sections. Accordingly, the characteristic information of the IGBT 110d can be stored in the memory 124a without increasing the total number of terminals of the IC.

In the first embodiment, the limiting voltage for the voltage-limiting circuit 123 is variably set in response to the ON/OFF threshold voltage of the IGBT 110d to control the IGBT 110d.

Figure 3A:
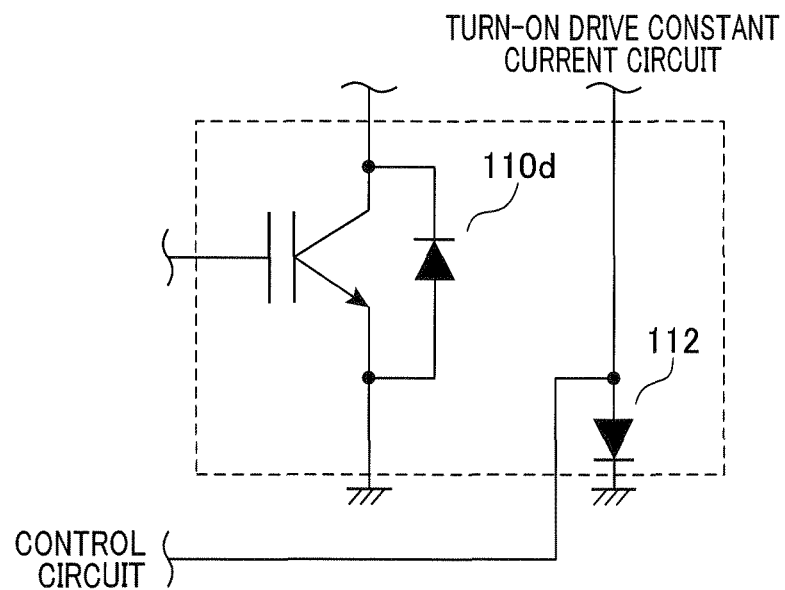
FIG. 3A schematically shows a first modification of a switching element of an inverter arrangement illustrated in FIG. 1.

In an alternative embodiment, the control circuit 124 may be configured to detect a temperature of the switching element IGBT 110d driven by the turn-on drive constant current circuit 121. As shown in FIG. 3A, the IGBT 110d may be provided with a temperature detection diode 112. One end of the temperature detection diode 112 is electrically connected to the turn-on drive constant current circuit 121 and the other end of the temperature detection diode 112 is electrically connected to ground for the high-voltage battery. The one end of the temperature detection diode 112 is also electrically connected to the control circuit 124.

The characteristic information stored in the memory 124a includes a previously measured correspondence table between the temperature of the switching element IGBT 110d and the ON/OFF threshold voltage of the IGBT 110d, where the temperature of the switching element IGBT 110d can be detected from a previously measured correspondence table between the temperature of the switching element IGBT 110d and a voltage across the temperature detection diode 112.

The control circuit 124 variably sets the limiting voltage in response to the ON/OFF threshold voltage of the IGBT 110d corresponding to the detected value of temperature of the IGBT 110d. Even when the ON/OFF threshold voltage of the IGBT 110d varies with its temperature, variably setting the limiting voltage in response to the ON/OFF threshold voltage of the IGBT 110d corresponding to the detected value of temperature of the IGBT 110d allows the collector current following through the IGBT 110d to be suppressed properly in response to the characteristics of the IGBT 110d without being adversely affected by a variation in ON/OFF threshold voltage with temperature. Accordingly, the tolerance of the IGBT 110d to breakage can be ensured properly in response to the characteristics, and the steady state losses of the IGBT 110d can also be suppressed properly in response to the characteristics.

In the first embodiment, as shown in FIG. 2, the turn-on drive constant current circuit 121, the turn-off drive circuit 122, the voltage-limiting circuit 123, and the control circuit 124 drives only one switching element, i.e., the IGBT 110d.

Figure 3B:
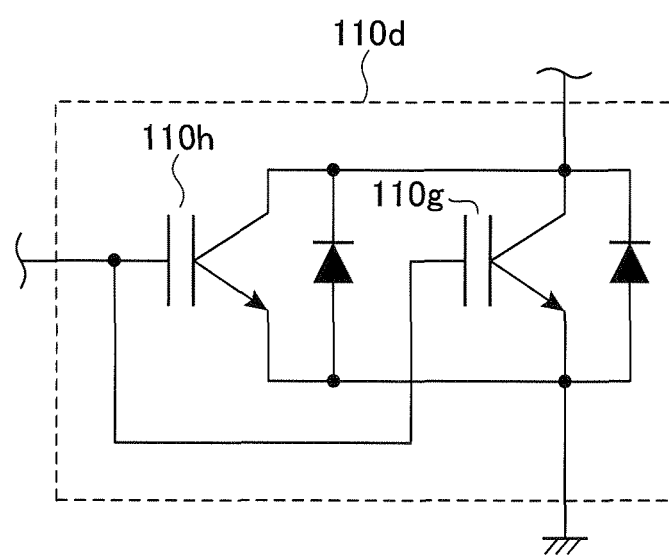
FIG. 3B schematically shows a second modification of a switching element of an inverter arrangement illustrated in FIG. 1.

In an alternative embodiment, the switching element IGBT 110d driven by the turn-on drive constant current circuit 121, the turn-off drive circuit 122, the voltage-limiting circuit 123, and the control circuit 124, may be composed of a plurality of sub-switching elements electrically connected in parallel with each other. For example, as shown in FIG. 3B, two IGBTs 110g, 110h (sub-switching elements) may be electrically connected in parallel with each other to form one switching element. The ON/OFF threshold voltage of the switching element may be set to the lowest one of the ON/OFF threshold voltage of the IGBT 110g and the ON/OFF threshold voltage of the IGBT 110h, and may be used to set the limiting voltage. Even in such an embodiment that the switching element is composed of two IGBTs 110g, 110h connected in parallel with each other, the tolerance to breakage can be ensured in response to the characteristics of the two IGBTs 110g, 110h.

The switching element driven by the turn-on drive constant current circuit 121, the turn-off drive circuit 122, the voltage-limiting circuit 123, and the control circuit 12, may be composed of more than two IGBTs (sub-switching elements) to form one switching element.

(Second Embodiment)

There will now be explained a motor control apparatus in accordance with a second embodiment of the present embodiment. The motor control apparatus in accordance with the second embodiment of the present invention variably sets a voltage-limiting time period from the time the voltage-limiting circuit 223 starts the gate voltage limitation to the time the voltage-limiting circuit 223 ends the gate voltage limitation in response to a gate-emitter capacitance (Qg) of the IGBT 210d to control the IGBT 210d, while the motor control apparatus 1 in accordance with the first embodiment of the present invention variably sets the limiting voltage of the voltage-limiting circuit 123 in response to the ON/OFF threshold voltage of the IGBT 110d to control the IGBT 110d.

Figure 4:
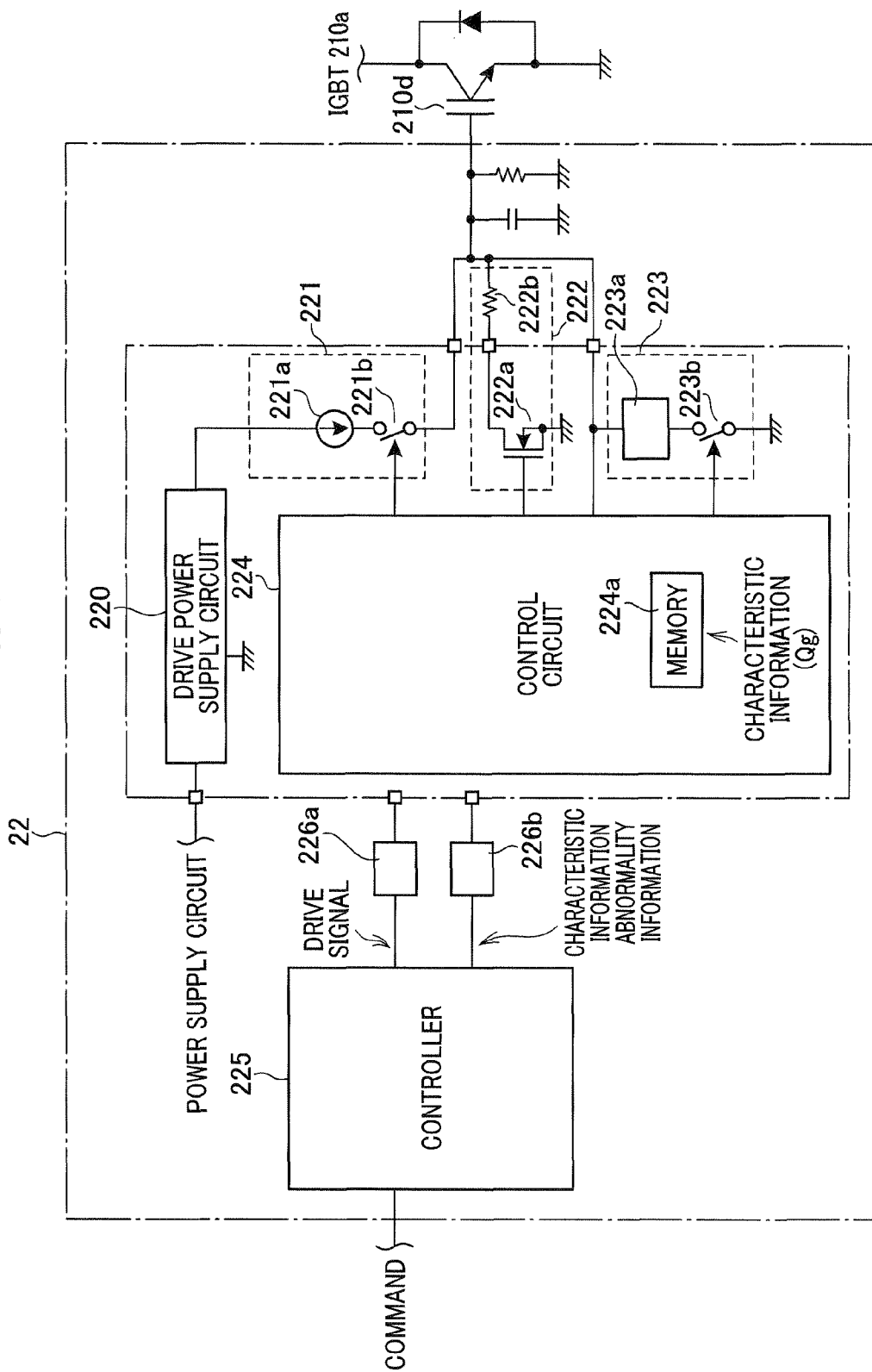
FIG. 4 schematically shows a circuit diagram of a control unit in accordance with a second embodiment of the present invention.

Operation and configuration of the control unit 22 will now be explained with reference to FIG. 4. FIG. 4 schematically shows a circuit diagram of the control unit 22 in accordance with the second embodiment of the present invention.

As shown in FIG. 4, the control unit 22 includes a drive power supply circuit 220, a turn-on drive constant current circuit 221, a turn-off drive circuit 222, a voltage-limiting circuit 223, a control circuit 224, and a controller 225, for the IGBT 210d. The IGBT 210d corresponds to the IGBT 110d of the first embodiment. The drive power supply circuit 220, the turn-on drive constant current circuit 221, the turn-off drive circuit 222, and the controller 225 are identical in configuration to the drive power supply circuit 120, the turn-on drive constant current circuit 121, the turn-off drive circuit 122, and the controller 125, respectively.

The voltage-limiting circuit 223 is operative to limit the gate voltage of the IGBT 210d so as not to exceed a limiting voltage for the voltage-limiting time period set by the control circuit 224. The voltage-limiting circuit 223 includes a clamp circuit 223a and a switch 223b.

The clamp circuit 223a limits the gate voltage of the IGBT 210d so as not to exceed the limiting voltage. One end of the clamp circuit 223a is electrically connected to the gate of the IGBT 210d. The other end of the clamp circuit 223a is electrically connected to the switch 123b.

The switch 223b connects the clamp circuit 223a to the gate of the IGBT 210d for the voltage-limiting time period set by the control circuit 224 in response to a command from the control circuit 224. One end of the switch 223b is electrically connected to the clamp circuit 223a. The other end of the switch 223b is electrically connected to ground for the high-voltage battery, through which the other end of the switch 223b is electrically connected to the negative terminal of the drive power supply circuit 220 and the emitter of the IGBT 210d. A control terminal of the switch 223b is electrically connected to the control circuit 224.

The control circuit 224, which includes a memory 224a, variably sets the voltage-limiting time period from the time the voltage-limiting circuit 223 starts the gate voltage limitation to the time the voltage-limiting circuit ends the gate voltage limitation in response to the gate-emitter capacitance of the IGBT 210d stored in the memory 224a, and controls the switch 223b so as to be in an ON state for the voltage-limiting time period. The control circuit 224 further controls the switch 221b and the turn-off drive FET 222a in response to a drive signal received from the controller 225.

The control circuit 224 is electrically connected to the controller 225, a control terminal of the switch 221b, and a gate of the turn-off drive FET 222a. The control circuit 224 is further electrically connected to the gate of the IGBT 210d and a control terminal of the switch 223b.

Figure 7B:
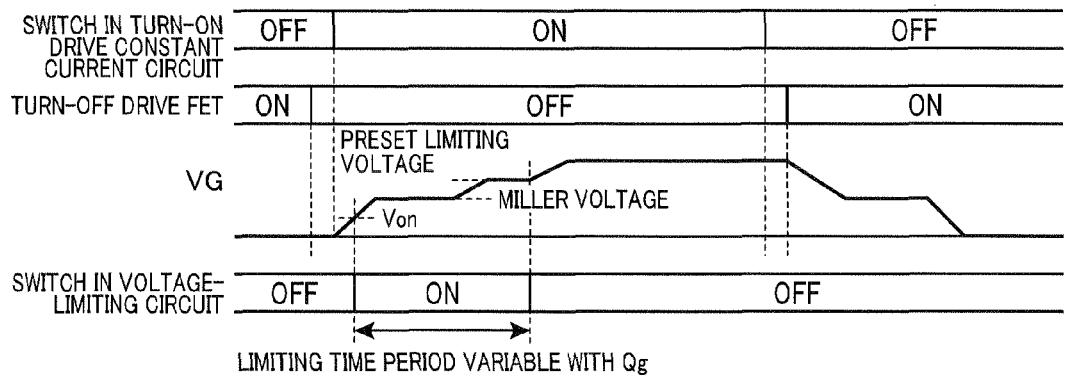
FIG. 7B schematically shows a timing diagram for the control unit in accordance with the second embodiment of the present invention.

A driving action of the IGBT 210d will now be explained with reference to FIG. 4 and FIG. 7B. Only differences of the control unit 22 of the second embodiment from the control unit 12 of the first embodiment will be explained.

The control circuit 224 variably sets the voltage-limiting time period for the voltage-limiting circuit 223 in response to the gate-emitter capacitance Qg of the IGBT 210d stored in the memory 224a as characteristic information.

When the drive signal received from the controller 225 through a photo-coupler 226a indicates turn-on of the IGBT 210d, the control circuit 224 turns off the turn-off drive FET 222a and turns on the switch 221b to apply a constant current from the constant current source 221a to the gate of the IGBT 210d. This allows the gate of the IGBT 210d to be charged, which leads to rise of the gate voltage.

When the gate voltage reaches a predetermined voltage $V_{ON}$ (preferably, equal to or higher than the ON/OFF threshold voltage Vth), the control circuit 224 turns on the switch 223b to start the gate voltage limitation. The gate voltage is raised, but is limited so as not to exceed the limiting voltage by the voltage-limiting circuit 223. The control circuit 224 turns off the switch 223b the voltage-limiting time period after the start of the gate voltage limitation to remove the limiting voltage. That is, the gate voltage is limited for the voltage-limiting time period set by the control circuit 224. After the gate voltage limitation is ended, the gate voltage is raised to the output voltage of the drive power supply circuit 220.

The gate-emitter capacitance is varied with IGBTs, which causes a difference in rising rate of the gate voltage of the IGBT 210d. This leads to a difference in timing when the IGBT 210d is turned on and thus to a difference in heat generation amount. However, in the second embodiment, variably setting the voltage-limiting time period in response to the gate-emitter capacitance can suppress the collector current flowing through the IGBT 210d during turn-on operation in response to its characteristics, thereby suppressing the heat generation amount of the IGBT 210d. This can ensure the tolerance of the IGBT 210d to breakage properly in response to its characteristics. In addition, variably setting the voltage-limiting time period in response to the gate-emitter capacitance can suppress the steady state losses of the IGBT 210d in response to its characteristics.

In the second embodiment, the voltage-limiting time period for the voltage-limiting circuit 223 is variably set in response to the gate-emitter capacitance of the IGBT 210*d* to control the IGBT 210*d*. In an alternative embodiment, the voltage-limiting time period for the voltage-limiting circuit 223 may be variably set in response to other characteristics of the IGBT 210*d* to control the IGBT 210*d*.

In the second embodiment, as shown in FIG. 4, the turn-on drive constant current circuit 221, the turn-off drive circuit 222, the voltage-limiting circuit 223, and the control circuit 224 drive only one switching element, i.e., the IGBT 210*d*.

In an alternative embodiment, the switching element IGBT 210*d* driven by the turn-on drive constant current circuit 221, the turn-off drive circuit 222, the voltage-limiting circuit 223, and the control circuit 224 may be composed of a plurality of sub-switching elements electrically connected in parallel with each other. For example, as shown in FIG. 3B (where in the second embodiment the numeral 110*d* should be replaced with 210*d*), two IGBTs 110*g*, 110*h* (sub-switching elements) may be electrically connected in parallel with each other to form one switching element. The gate-emitter capacitance of the switching element IGBT 210*d* may be set to a sum of the gate-emitter capacitance of the IGBT 110*g* and the gate-emitter capacitance of the IGBT 110*h*, and may be used to set the voltage-limiting time period. Even in such an embodiment that the switching element is composed of two IGBTs 110*g*, 110*h* connected in parallel with each other, the tolerance to breakage can be ensured in response to the characteristics of the two IGBTs 110*g*, 110*h*.

In a further alternative embodiment, the switching element driven by the turn-on drive constant current circuit 221, the turn-off drive circuit 222, the voltage-limiting circuit 223, and the control circuit 224 may be composed of more than two IGBTs (sub-switching elements) to form one switching element.

In the second embodiment, as shown in FIG. 4, the turn-on drive constant current circuit 221, the turn-off drive circuit 222, the voltage-limiting circuit 223, and the control circuit 224 drive the IGBT 210*d* having the gate, the collector, and the emitter.

Figure 5A:
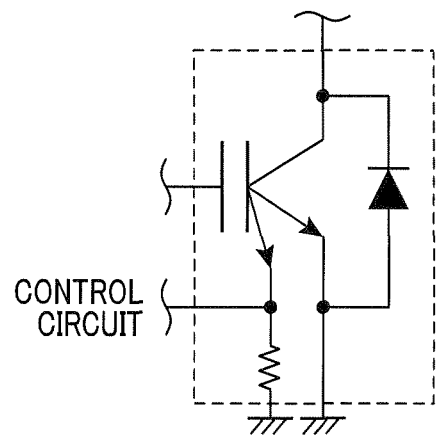
FIG. 5A schematically shows a modification of a switching element illustrated in FIG. 4.

In an alternative embodiment, as shown in FIG. 5A, the switching element IGBT 210*d* driven by the turn-on drive constant current circuit 221, the turn-off drive circuit 222, the voltage-limiting circuit 223, and the control circuit 224, may be provided with a current sense terminal, via which a current that is smaller than and proportional to the collector current flows. The current sense terminal is electrically connected to ground for the high-voltage battery through a resistor. The current sense terminal is also electrically connected to the control circuit 224, whereby the control circuit 224 can detect the collector current by detecting a voltage across the resistor.

Figure 5B:
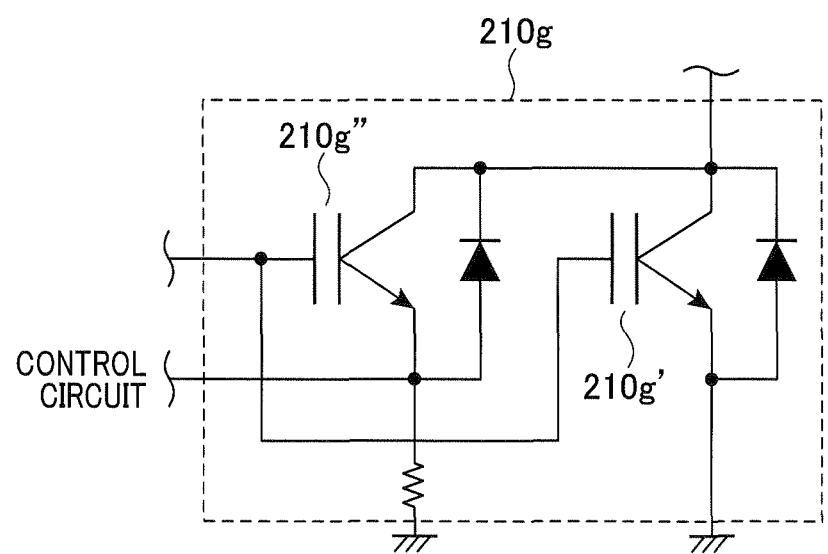
FIG. 5B schematically shows an equivalent circuit diagram of the switching element of FIG. 5A.

Equivalently, as shown in FIG. 5B, the IGBT 210*g* (equivalent to IGBT 210*d*) may be composed of a main IGBT 210*g*' (main switching element) and a current detection IGBT 210*g*" through which a current that is smaller than and proportional to a current following through the IGBT 210*g*' flows. In such an embodiment, the voltage-limiting time period may be variably set in response to the characteristic information including the ON/OFF threshold voltage of the IGBT 210*g*' and the ON/OFF threshold voltage of the IGBT 210" and the gate-emitter capacitance of the IGBT 210*g*. The control circuit 224 may variably set the voltage-limiting time period in response to an inter-terminal capacitance of the IGBT 210*g* and a voltage difference between the ON/OFF threshold voltage of the IGBT 210*g*' and the ON/OFF threshold voltage of the IGBT 210*g*" to control the IGBT 210*g*. Even in the embodiment where the IGBT 210*g* is composed of the main IGBT 210*g*' and the current detection IGBT 210*g*", the tolerance of the IGBT 210*g* to breakage can be ensured properly in response to the characteristics, and the steady state losses of the IGBT 210*g* can also be suppressed properly in response to the characteristics.

(Third Embodiment)

There will now be explained a motor control apparatus in accordance with a third embodiment of the present invention. The motor control apparatus in accordance with the third embodiment of the present invention estimates a Miller voltage on the basis of an ON/OFF threshold voltage (Vth) and a gate-emitter capacitance (Qg) of an IGBT 310*d* to control a constant current to be applied to a gate of the IGBT 310*d* in response to the estimated Miller voltage, while in the motor control apparatus 1 in accordance with the first embodiment of the present invention the constant current applied to the gate of the IGBT 110*d* is fixed at a given level.

Operation and configuration of the control unit 32 will now be explained with reference to FIG. 6. FIG. 6 schematically shows a circuit diagram of the control unit 32 in accordance with the third embodiment of the present invention.

As shown in FIG. 6, the control unit 32 includes a drive power supply circuit 320, a turn-on drive constant current circuit 321, a turn-off drive circuit 322, a voltage-limiting circuit 323, a control circuit 324, and a controller 325, for the IGBT 310*d*. The IGBT 310*d* corresponds to the IGBT 110*d* of the first embodiment. The drive power supply circuit 320, the turn-off drive circuit 322, the voltage-limiting circuit 323, and the controller 325 are identical in configuration to the drive power supply circuit 120, the turn-off drive circuit 122, the voltage-limiting circuit 123, and the controller 125, respectively.

The turn-on drive constant current circuit 321 is operative to turn on the IGBT 310*d* in response to a command from the control circuit 324 by applying a constant current indicated by the command to the gate of IGBT 310*d*, thereby raising a gate voltage above the ON/OFF threshold voltage Vth. The turn-on drive constant current circuit 321 includes a constant current source 321*a* and a switch 321*b*.

The constant current source 321*a* outputs the constant current instructed by the control circuit 324. A power supply terminal of the constant current source 321*a* is electrically connected to a positive terminal of the drive power supply circuit 320. An output terminal of the constant current source 321*a* is electrically connected to the switch 321*b*. A control terminal of the constant current source 321*a* is electrically connected to the control circuit 324.

The switch 321*b* is operative to connect the constant current source 321*a* to the gate of the IGBT 310*d* in response to a command from the control circuit 324. One end of the switch 321*b* is electrically connected to an output terminal of the constant current source 321*a*. The other end of the switch 321*b* is electrically connected to the gate of the IGBT 310*d*. A control terminal of the switch 321*b* is electrically connected to the control circuit 324.

The control circuit 324, which includes a memory 324*a*, estimates the Miller voltage of the IGBT310*d* on the basis of the ON/OFF threshold voltage Vth and the gate-emitter capacitance Qg of the IGBT 310*d* stored in the memory 324*a* as characteristic information of the IGBT 310*d*, and controls the constant current source 321*a* so that the constant current applied to the gate of the IGBT 310*d* when the gate voltage of the IGBT 310*d* is lower than the estimated Miller voltage is smaller than the constant current applied to the gate of the IGBT 310*d* when the gate voltage of the IGBT 310*d* is equal to or higher than the estimated Miller voltage. The control circuit 324 further controls the switch 321*b* and the turn-off drive FET 322*a* in response to a drive signal received from the controller 325.

The control circuit 324 is electrically connected to the controller 325, the control terminal of the constant current source 321a, the control terminal of the switch 321b, and a gate of the turn-off drive FET 322a. The control circuit 324 is further electrically connected to the gate of the IGBT 310d and a control terminal of the switch 323b.

Figure 7C:
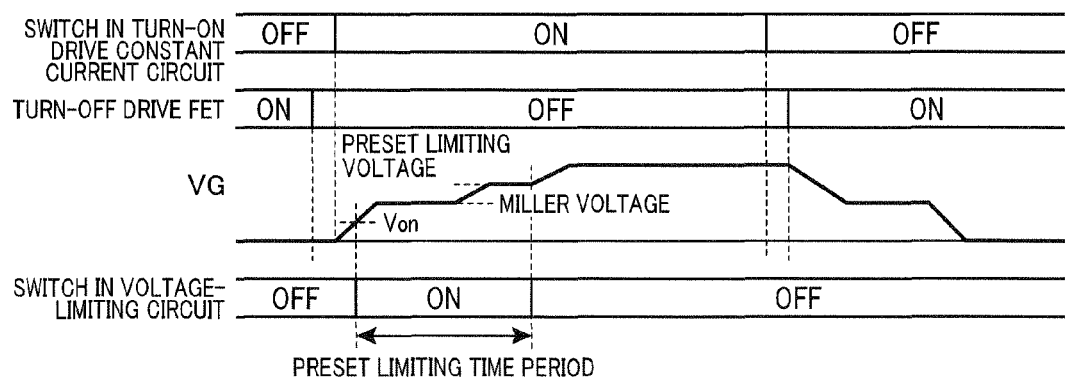
FIG. 7C schematically shows a timing diagram for the control unit in accordance with the third embodiment of the present invention.

A driving action of the IGBT 310d will now be explained with reference to FIG. 6 and FIG. 7C. Only differences of the control unit 32 of the third embodiment from the control unit 12 of the first embodiment will be explained.

The control circuit 324 estimates the Miller voltage of the IGBT 310d on the basis of the ON/OFF threshold voltage and the gate-emitter capacitance of the IGBT 310d stored in the memory 324a. When the drive signal received from the controller 325 through a photo-coupler 326a indicates turn-on of the IGBT 310d, the control circuit 324 turns off the turn-off drive FET 322a and turns on the switch 321b to apply the constant current from the constant current source 321a to the gate of the IGBT 310d. This allows the gate of the IGBT 310d to be charged, which leads to rise of the gate voltage of the IGBT 310d.

The control circuit 324 controls the constant current source 321a from the constant current source 321a so that the constant current applied to the gate of the IGBT 310d when the gate voltage of the IGBT 310d is lower than the estimated Miller voltage is smaller than the constant current applied to the gate of the IGBT 310d when the gate voltage of the IGBT 310d is equal to or higher than the estimated Miller voltage.

In the third embodiment described above, the turn-on drive constant current circuit 321 can be controlled in response to the characteristic information of the IGBT 310d previously stored in the memory 324a. This allows the collector current flowing through the IGBT 310d to be suppressed properly in response to its characteristics, and thus allows a surge voltage of the IGBT 310d to be suppressed properly in response to its characteristics.

In the third embodiment, the surge voltage of the IGBT 310d is determined as a function of the constant current applied to the gate of the IGBT 310d until the gate voltage of the IGBT 310d reaches the Miller voltage, where the Miller voltage of the IGBT 310d is determined as a function of the ON/OFF threshold voltage and the gate-emitter capacitance of the IGBT 310d. In consideration of the above, while the gate voltage of the IGBT 310d is lower than the Miller voltage estimated on the basis of the ON/OFF threshold voltage and the gate-emitter capacitance of the IGBT 310d, the constant current applied to the gate of the IGBT 310d is limited lower than the constant current when the gate voltage of the IGBT 310d is equal to or higher than the Miller voltage, which can suppress the surge voltage of the IGBT 310d properly in response to its characteristics.

In the third embodiment, the IGBT 310d is controlled in response to whether or not the gate voltage of the IGBT 310d is lower than the Miller voltage estimated on the basis of the ON/OFF threshold voltage Vth and the gate-emitter capacitance Qg of the IGBT 310d.

In an alternative embodiment, the control circuit 324 may be configured to detect a temperature of the IGBT 310d (see also FIG. 3A, where in the present embodiment the numeral 110d should be replaced with 310d), and the IGBT 310d may be controlled in response to whether or not the gate voltage of the IGBT 310d is lower than the Miller voltage estimated on the basis of a detected value of temperature of the IGBT 310d, the ON/OFF threshold voltage, and the gate-emitter capacitance of the IGBT 310d. In such an embodiment, even when the Miller voltage of the IGBT 310d varies with temperature of the IGBT 310d, estimating the Miller voltage taking into account its dependence on temperature of the IGBT 310d allows the surge voltage of the IGBT 310d to be suppressed properly in response to the characteristics without being adversely affected by a variation in Miller voltage with temperature of the IGBT 310d.

In a further alternative embodiment similar to the embodiment described with reference to FIG. 5A, the control circuit 324 may be configured to detect the collector current flowing through the IGBT 310d, and the IGBT 310d may be controlled in response to whether or not the gate voltage of the IGBT 310d is lower than the Miller voltage estimated on the basis of a detected value of collector current flowing through the IGBT 310d, the ON/OFF threshold voltage of the IGBT 310d, and the gate-emitter capacitance of the IGBT 310d. The collector current flowing through the IGBT 310d can be detected by detecting a current following through the current sense terminal that is smaller than and proportional to the collector current flowing through the IGBT 310d. In such an embodiment, even when the Miller voltage of the IGBT 310d varies with collector current flowing through the IGBT 310d, estimating the Miller voltage taking into account the detected value of collector current flowing through the IGBT 310d allows the surge voltage of the IGBT 310d to be suppressed properly in response to the characteristics without being adversely affected by a variation in Miller voltage with collector current flowing through the IGBT 310d.

In the third embodiment, as shown in FIG. 6, the turn-on drive constant current circuit 321, the turn-off drive circuit 322, the voltage-limiting circuit 323, and the control circuit 324 drives only one switching element, i.e., the IGBT 310d.

In an alternative embodiment, the switching element driven by the turn-on drive constant current circuit 321, the turn-off drive circuit 322, the voltage-limiting circuit 323, and the control circuit 324, may be composed of a plurality of sub-switching elements electrically connected in parallel with each other. For example, as shown in FIG. 3B where in the present embodiment the numeral 110d should be replaced with 310d, two IGBTs 110g, 110h (sub-switching elements) may be electrically connected in parallel with each other to form one switching element. In such an embodiment, the ON/OFF threshold voltage of the switching element used to estimate the Miller voltage may be set to the lowest one of the ON/OFF threshold voltage of the IGBT 110g and the ON/OFF threshold voltage of the IGBT 110h, and the gate-emitter capacitance of the switching element used to estimate the Miller voltage may be set to a sum of the gate-emitter capacitance of the IGBT 110g and the gate-emitter capacitance of the IGBT 110h. Even in such an embodiment that the switching element is composed of two IGBTs 110g, 110h connected in parallel with each other, the surge voltage of the IGBT 310d can be suppressed properly in response to the characteristics of the two IGBTs 110g, 110h.

In a further alternative embodiment, the switching element driven by the turn-on drive constant current circuit 321, the turn-off drive circuit 322, the voltage-limiting circuit 323, and the control circuit 324 may be composed of more than two IGBTs (sub-switching elements) to form one switching element.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A switching element control apparatus comprising:
a constant current circuit that applies a constant current to a control terminal of a switching element driven by controlling a voltage on the control terminal;
a voltage-limiting circuit that limits the voltage on the control terminal of the switching element so as not to exceed a limiting voltage set in the voltage-limiting circuit; and
a control circuit that controls the constant current circuit to apply the constant current to the control terminal of the switching element when the control circuit receives a drive signal for turning on the switching element, and controls the voltage-limiting circuit to limit the voltage on the control terminal of the switching element for a voltage-limiting time period,
wherein the control circuit comprises a memory storing characteristic information of the switching element and variably sets at least one of the limiting voltage, the voltage-limiting time period, and the constant current in response to the characteristic information stored in the memory,
the characteristic information includes an ON/OFF threshold voltage of the switching element, and
the control circuit variably sets the limiting voltage of the voltage-limiting circuit to be higher than the ON/OFF threshold voltage of the switching element.

2. The apparatus of claim 1, further comprising temperature detection means for detecting a temperature of the switching element,
wherein the control circuit variably sets the limiting voltage of the voltage-limiting circuit in response to a detected value of temperature of the switching element and the ON/OFF threshold voltage of the switching element.

3. The apparatus of claim 1, wherein the switching element comprises a plurality of sub-switching elements electrically connected in parallel with each other, and
the control circuit variably sets the limiting voltage of the voltage-limiting circuit to be higher than the lowest one of the ON/OFF threshold voltages of the respective sub-switching elements.

4. The apparatus of claim 1, wherein
the characteristic information also includes an inter-terminal capacitance of the switching element, and
the control circuit variably sets the voltage-limiting time period in response to the inter-terminal capacitance of the switching element.

5. The apparatus of claim 4, wherein the switching element comprises a plurality of sub-switching elements electrically connected in parallel with each other,
the control circuit variably sets the voltage-limiting time period in response to a sum of inter-terminal capacitances of the respective sub-switching elements.

6. The apparatus of claim 4, wherein the switching element comprises a first sub-switching element and a second sub-switching element such that a current flowing through the second sub-switching element is smaller than and proportional to a current following through the first sub-switching element,
the characteristic information includes the inter-terminal capacitance of the switching element, an ON/OFF threshold of the first sub-switching element, and an ON/OFF threshold voltage of the second sub-switching element,
the control circuit variably sets the voltage-limiting time period in response to the inter-terminal capacitance of the switching element and a difference between the ON/OFF threshold of the first sub-switching element and the ON/OFF threshold voltage of the second sub-switching element.

7. The apparatus of claim 1, wherein
the control circuit variably sets the constant current in response to the characteristic information stored in the memory.

8. The apparatus of claim 7, wherein
the characteristic information includes an ON/OFF threshold voltage and an inter-terminal capacitance of the switching element, and
the control circuit estimates a Miller voltage of the switching element on the basis of the ON/OFF threshold voltage and the inter-terminal capacitance of the switching element, and variably sets the constant current so that the constant current applied to the control terminal of the switching element when the voltage on the control terminal of the switching element is lower than the estimated Miller voltage is smaller than the constant current applied to the control terminal of the switching element when the voltage on the control terminal of the switching element is equal to or higher than the estimated Miller voltage.

9. The apparatus of claim 8, further comprising temperature detection means for detecting a temperature of the switching element, wherein
the control circuit estimates the Miller voltage of the switching element on the basis of a detected value of temperature of the switching element, the ON/OFF threshold voltage of the switching element, and the gate-emitter capacitance of the switching element.

10. The apparatus of claim 8, further comprising current detection means for detecting a current flowing through the switching element, wherein
the control circuit estimates the Miller voltage of the switching element on the basis of a detected value of current flowing through the switching element, the ON/OFF threshold voltage of the switching element, and the gate-emitter capacitance of the switching element.

11. The apparatus of claim 8, wherein the switching element comprises a plurality of sub-switching elements electrically connected in parallel with each other,
the control circuit estimates the Miller voltage of the switching element on the basis of the lowest one of the ON/OFF threshold voltages of the respective sub-switching elements and a sum of inter-terminal capacitances of the respective sub-switching elements.

12. The apparatus of claim 1, further comprising a controller that outputs the drive signal to the control circuit,
wherein the control circuit outputs the characteristic information stored in the memory to the controller.

13. The apparatus of claim 12, wherein when the control circuit is unable to read the characteristic information of the switching element from the memory, the control circuit outputs abnormality information to the controller,
the controller stops outputting of the drive signal to the control circuit when the controller receives the abnormality information from the control circuit.

14. The apparatus of claim 12, wherein the controller determines whether or not there exists an abnormality in the characteristic information received from the control circuit, and when it is determined that there exists an abnormality in the characteristic information, the controller stops outputting of the drive signal to the control circuit.

15. The apparatus of claim 1, wherein the characteristic information of the switching element is measured and stored previously in the memory.

16. The apparatus of claim 12, wherein the control circuit is integrated in an integrated circuit (IC) having a plurality of terminals, the memory is electrically connected to at least one of the plurality of terminals that is electrically connected to at least one of the constant current circuit, voltage-limiting circuit, and the controller, and the characteristic information of the switching element is stored in the memory via the at least one terminal.

17. The apparatus of claim 1, wherein the memory is a nonvolatile memory.

18. The apparatus of claim 1, further comprising turn-off means for turning off the switching element, wherein the control circuit controls the turn-off means to turn off the switching element in response to a drive signal for turning off the switching element.

19. The apparatus of claim 1, wherein the switching element is an insulated gate bipolar transistor (IGBT), the control terminal of the switching element is a gate of the IGBT.

\* \* \* \* \*